(12) United States Patent
Kase et al.

(10) Patent No.: US 7,420,394 B2
(45) Date of Patent: Sep. 2, 2008

(54) LATCHING INPUT BUFFER CIRCUIT WITH VARIABLE HYSTERESIS

(75) Inventors: Kiyoshi Kase, Austin, TX (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/561,209

(22) Filed: Nov. 17, 2006

(65) Prior Publication Data

US 2008/0116952 A1    May 22, 2008

(51) Int. Cl.
*H03K 19/094* (2006.01)
(52) U.S. Cl. .......................................... 326/83; 326/87
(58) Field of Classification Search .................. 326/82, 326/83, 86, 87; 327/108, 109
See application file for complete search history.

(56) References Cited

U.S. PATENT DOCUMENTS

| 4,071,784 | A | | 1/1978 | Maeder et al. |
| 4,888,498 | A | * | 12/1989 | Kadakia ...................... 327/546 |
| 5,177,376 | A | | 1/1993 | Wellnitz et al. |
| 5,812,462 | A | * | 9/1998 | Merritt .................. 365/189.05 |
| 5,973,509 | A | * | 10/1999 | Taniguchi et al. ............. 326/81 |
| 6,975,153 | B2 | | 12/2005 | Hinterscher |

* cited by examiner

*Primary Examiner*—Rexford Barnie
*Assistant Examiner*—Thienvu V Tran
(74) *Attorney, Agent, or Firm*—Daniel D. Hill; David G. Dolezal

(57) ABSTRACT

An input buffer circuit with hysteresis includes a first stage and a second stage. The first stage includes a resistive device to provide a resistance between two nodes of the first stage. The two nodes are responsive to a signal input. The second stage includes four series-coupled transistors. A first node is coupled to the control electrodes of two of the four transistors and the second node is coupled to the control electrodes of the other two transistors. The second stage includes a signal output. In some examples, a resistance provided by the resistive device is variable and provides the buffer circuit with hysteresis.

19 Claims, 2 Drawing Sheets

LATCHING INPUT BUFFER CIRCUIT WITH VARIABLE HYSTERESIS

FIELD OF THE INVENTION

This invention relates to integrated circuits, and more particularly to an input buffer circuit with variable hysteresis.

BACKGROUND OF THE INVENTION

Input buffers are used to condition signals transmitted to an integrated circuit from an external source. A common input buffer includes a simple CMOS (complementary metal-oxide semiconductor) inverter circuit having a P-channel transistor coupled in series with an N-channel transistor. The gates of the transistors are coupled together to receive an input signal. A common problem with this type of circuit is that as the input signal is transitioning from one logic state to another there is a point when both the P-channel and N-channel transistors are both conducting at the same time, causing a current, sometimes referred to as a crowbar current, to flow through both devices for a short period. The circuit of FIG. 1, described below, has been used to reduce the crowbar current in an input buffer.

FIG. 1 illustrates a schematic diagram of a prior art input buffer circuit 10. To reduce the crowbar current, input buffer circuit 10 includes a resistor 13 between a P-channel transistor 12 and an N-channel transistor 14 that make up an inverter circuit. There are two outputs from the inverter, labeled "A" and "B", separated from each other by resistor 13. Output A is coupled to drive the gate of P-channel transistor 16 and output B is coupled to drive the gate of N-channel transistor 18. The resistor functions to prevent P-channel transistor 16 from being conductive at the same time N-channel transistor 18 is conductive when an input signal IN transitions from, for example, a logic low voltage to a logic high voltage. This reduces the crowbar current and thus reduces power consumption.

Frequently, input buffers with hysteresis characteristics are necessary, such as in circuits that handle low frequency signals. A circuit with hysteresis has two switching voltage levels, an upper level and a lower level. As a signal transitions from a logic low to a logic high, the circuit will switch states as the signal passes the upper voltage level. As the signal transitions from a logic high to a logic low, the circuit will switch states as the signal passes the lower voltage level. This prevents the circuit from inadvertently switching states in response to a rapidly changing signal due to, for example, noise. A problem with some existing input buffers with hysteresis is that a relatively high amount of power is consumed to provide the hysteresis. Therefore, what is needed is an input buffer with hysteresis with lower power consumption.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
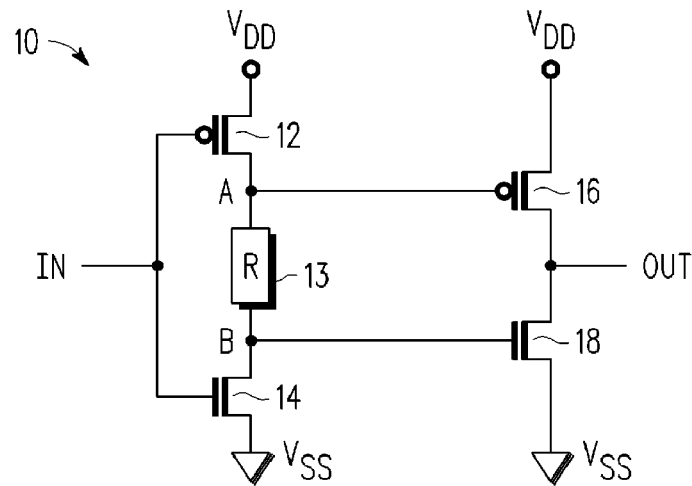
FIG. 1 illustrates, in schematic diagram form, a prior art input buffer circuit.

Generally, the present invention provides, in one embodiment, a latching input buffer with hysteresis. The latching input buffer includes a first stage, a second stage, and a latch stage. The first stage includes an inverter with a variable resistor coupled between series-coupled transistors of the inverter. The inverter has two outputs for driving the second stage. The second stage uses the two outputs of the inverter to provide hysteresis for the input buffer. The amount of hysteresis is changed by changing a resistance value of the variable resistor. In one embodiment, an integrated circuit having the input buffer circuit operates in a low frequency mode and in a high frequency mode. In the low frequency mode, hysteresis is increased for an input signal having a relatively low frequency. In the high frequency mode, hysteresis is decreased for an input signal having a relatively higher frequency. In another embodiment, the latching input buffer is tri-stateable.

In one aspect, a buffer circuit includes a first buffer stage and a second buffer stage. The first buffer stage includes a signal input, a first node responsive to the signal input, a second node responsive to the signal input, and a resistive device coupled between the first node and the second node. The second buffer stage includes a signal output, a first transistor having a control electrode coupled to the first node, a second transistor having a control electrode coupled to the second node, a third transistor having a control electrode coupled to the first node, and a fourth transistor including a control electrode coupled to the second node. The first transistor, the second transistor, the third transistor, and the fourth transistor are series coupled transistors coupled between a first voltage terminal and a second voltage terminal.

In another aspect, a buffer circuit includes a signal input, a first transistor having a control electrode connected to the signal input, a second transistor having a control electrode connected to the signal input, a first node connected to a first current terminal of the first transistor, a second node connected to a first current terminal of the second transistor, a resistive device coupled to provide a resistance between the first node and the second node, a third transistor having a control electrode connected to the first node, a fourth transistor having a control electrode connected to the second node, a fifth transistor having a control electrode connected to the first node, a sixth transistor having a control electrode connected to the second node, and a signal output connected to a current electrode of the fourth transistor and a current electrode of the fifth transistor. The third, fourth, fifth, and sixth transistors are coupled in series. The third transistor and the fourth transistor are of a first conductivity type and the fifth transistor and sixth transistor of a second conductivity type opposite the first conductivity type.

In yet another aspect, a buffer circuit includes a first buffer stage and a second buffer stage. The first buffer stage includes a signal input, a first node responsive to the signal input, a second node responsive to the signal input, and a resistive device coupled between the first node and the second node. The second buffer stage includes a signal output, a first transistor including a control electrode coupled to the first node, a second transistor including a control electrode coupled to the second node, a third transistor including a control electrode coupled to the first node, and a fourth transistor including a control electrode coupled to the second node. The first transistor, the second transistor, the third transistor, and the fourth transistor are series coupled transistors coupled between a first voltage terminal and a second voltage terminal. A latch circuit is coupled to the signal output to latch a state of the signal output. A tri-state circuit is configured so that when enabled, the tri-state circuit pulls a voltage level of the first node to a voltage level of the first voltage terminal and pulls a voltage level of the second node to a voltage level of the second voltage terminal. The latch circuit retains the previous state of the signal output when the tri-state circuit is enabled.

The term "coupled", as used herein, is defined as connected, although not necessarily directly, and not necessarily mechanically.

Figure 2:
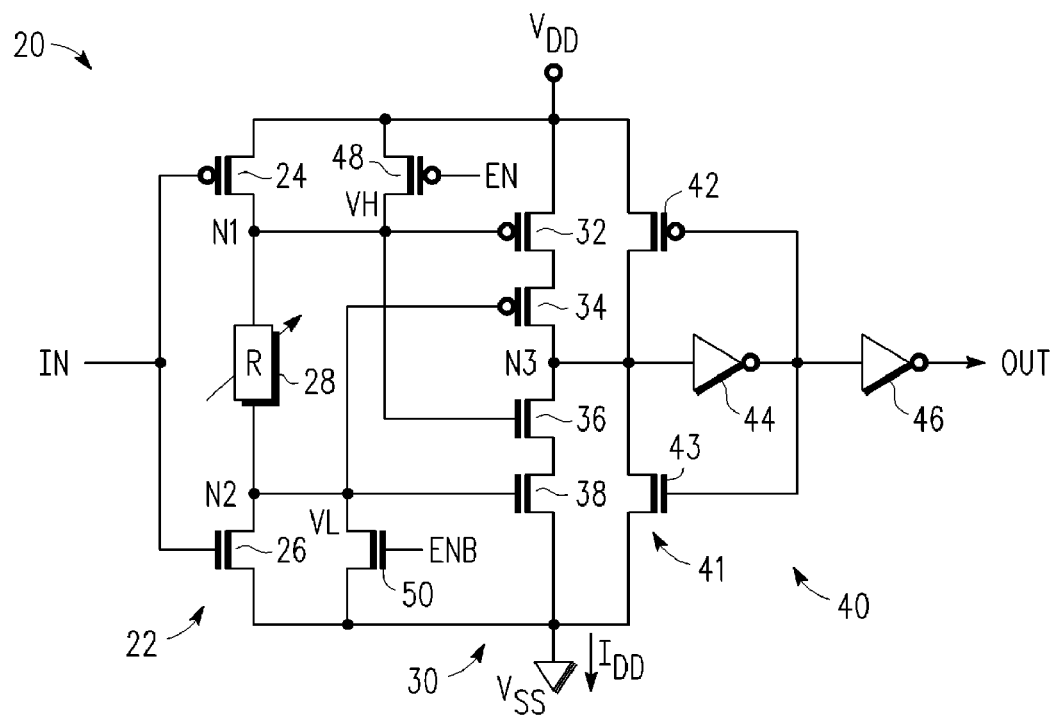
FIG. 2 illustrates, in schematic diagram form, an input buffer circuit with hysteresis in accordance with an embodiment.

FIG. 2 illustrates, in schematic diagram form, an input buffer circuit 20 in accordance with an embodiment. Input buffer circuit 20 includes a first stage 22, a second stage 30, latch 40, inverter 46, P-channel transistor 48, and N-channel transistor 50. First stage 22 includes P-channel transistor 24, N-channel transistor 26, and variable resistor 28. Second stage 30 includes P-channel transistors 32 and 34 and N-channel transistors 36 and 38. Latch 40 includes a pair of cross-coupled inverters 41 and 44. Inverter 41 includes P-channel transistor 42 and N-channel transistor 43.

Figure 3:
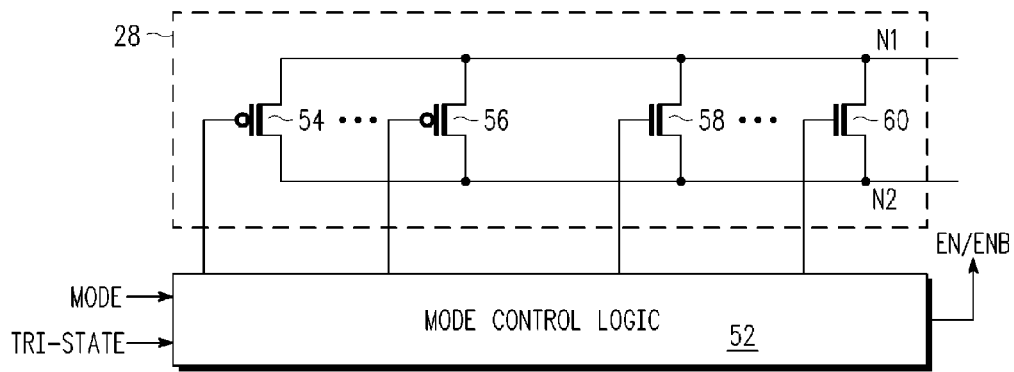
FIG. 3 illustrates a variable resistor and mode control circuit for use with the input buffer of FIG. 2.

In first stage 22, P-channel transistor 24 has a source (current electrode) connected to a power supply voltage terminal labeled "VDD", a gate (control electrode) coupled to receive an input signal labeled "IN", and a drain (current electrode) connected to a first node N1. Variable resistor 28 has a first terminal coupled to a first node N1, and a second terminal coupled to a second node N2. One embodiment of variable resistor 28 is illustrated in FIG. 3 in more detail. In other embodiments, variable resistor 28 may be implemented differently. N-channel transistor 26 has a drain connected to the second node N2, a gate connected to receive input signal IN, and a source connected to a power supply voltage terminal labeled "VSS". In one embodiment, VDD is provided with a power supply voltage equal to about one volt, and VSS is coupled to ground. In another embodiment, the power supply voltages may be different.

In second stage 30, P-channel transistor 32 has a source connected to VDD, a gate connected to node N1, and a drain. P-channel transistor 34 has a source connected to the drain of P-channel transistor 32, a gate connected to node N2, and a drain connected to a node N3. N-channel transistor 36 has a drain connected to the drain of transistor 34 at node N3. N-channel transistor 38 has a drain connected to the source of transistor 36, a gate connected to node N2, and a source connected to VSS.

The latch 40 is provided by the pair of cross-coupled inverters 41 and 44. In inverter 41, P-channel transistor 42 has a source connected to VDD, a gate, and a drain connected to node N3. N-channel transistor 43 has a drain connected to the drain of P-channel transistor 42, a gate connected to the gate of P-channel transistor 42, and a source connected to VSS. Inverter 44 has an input connected to node N3, and an output connected to the gates of transistors 42 and 43.

In one embodiment, input buffer 20 includes a circuit for tri-stating node N3. The circuit for tri-stating includes P-channel transistor 48 and N-channel transistor 50. P-channel transistor 48 has a source connected to VDD, a gate for receiving an enable signal labeled "EN", and a drain connected to the gates of transistors 32 and 36. N-channel transistors 50 has a drain connected to the gates of transistors 34 and 38, a gate for receiving an enable signal labeled "ENB", and a source connected to VSS.

FIG. 3 illustrates variable resistor 28 and mode control circuit 52 for use with input buffer 20 of FIG. 2. Variable resistor 28 includes a plurality of parallel-connected transistors coupled between nodes N1 and N2. In FIG. 3, the plurality of transistors is represented by P-channel transistors 54 and 56, and N-channel transistors 58 and 60. There may be any number of P-channel and N-channel transistors, including only one, depending on how many different resistance values an application requires. Gates of the plurality of transistors are coupled to output terminals of mode control logic 52. Mode control logic 52 includes an input terminal for receiving a mode signal labeled "MODE", and an input terminal for receiving a tri-state enable signal labeled "TRI-STATE", and an output for providing tri-state enable signals labeled "EN" and "ENB" to the gates of transistors 48 and 50, respectively, in FIG. 2. Note that a signal name ending with a "B" is a logical complement of a signal having the same name but lacking the "B". Note that the MODE and TRI-STATE signals can be provided by a logic circuit implemented on the same integrated circuit as the input buffer, or by a source external to the integrated circuit.

In one embodiment, variable resistance 28 can be changed between two resistance values; a high resistance value for low speed operation and a low resistance value for high speed operation. As can be seen in FIG. 2, a high resistance value adds more hysteresis to the input buffer circuit by increasing a voltage difference between nodes N1 and N2, which is useful during low speed operation. Conversely, the low resistance value reduces the amount of hysteresis by decreasing a voltage difference between nodes N1 and N2 for high speed operation. Note that the resistance of variable resistor 28 can be adjusted to be zero so that a voltage difference between nodes N1 and N2 is zero. The resistance of variable resistor 28 is adjusted by controlling how many of the transistors 54, 56, 58, and 60 are conductive. In one embodiment, the resistance value is decreased by increasing the number of transistors that are conductive, and increased by decreasing the number of transistors that are conductive. Also, in one embodiment, the transistors of variable resistor 28 can have different gate lengths and gate widths to provide for different resistance values.

Figure 4:
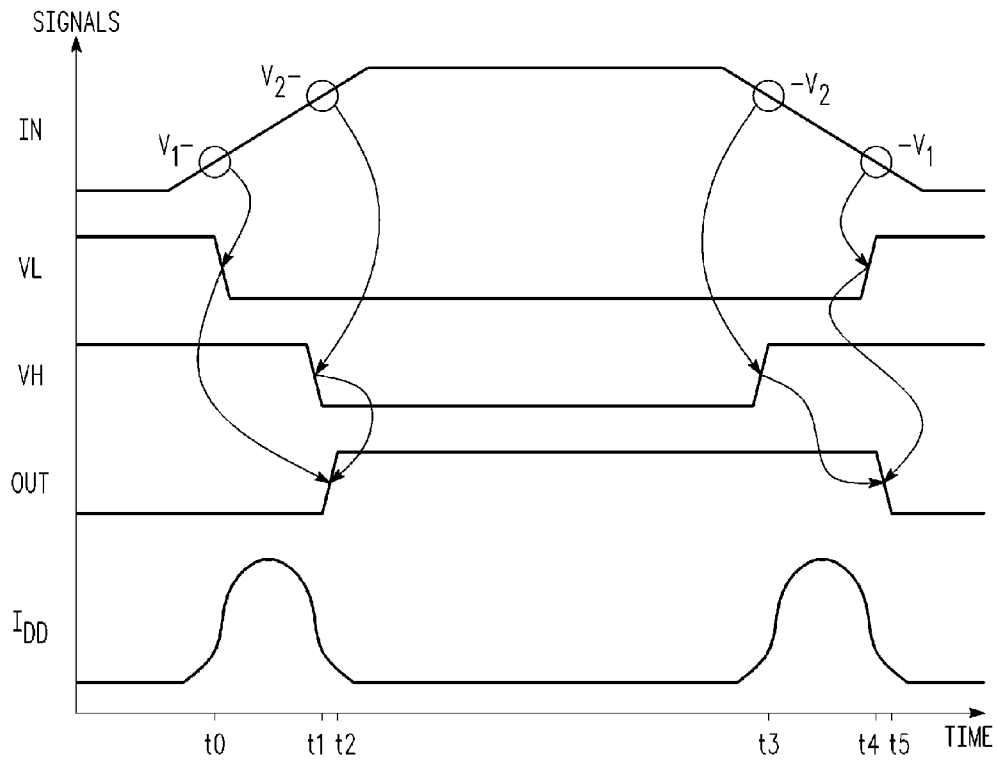
FIG. 4 illustrates a timing diagram of various signals of the circuit of FIG. 2.

FIG. 4 illustrates a timing diagram of various signals of the circuit of FIG. 1. The normal operation of input buffer 20 will be described with reference to FIG. 2, FIG. 3, and FIG. 4.

During normal operation, tri-state transistors 48 and 50 are made to be substantially non-conductive by de-asserting signal TRI-STATE to cause signal ENB to be a logic low and EN to be a logic high. In the timing diagram of FIG. 4, prior to time t0, input signal IN is a logic low. Transistor 24 is conductive and transistor 26 is substantially non-conductive causing voltages VH and VL to be high. Input signal IN begins a transition from a logic low to a logic high. Voltage levels V1 and V2 on input signal IN represent voltages that are set by the resistance value of variable resistor 28. As signal IN increases past voltage level V1, transistor 26 starts to become conductive causing voltage VL at node N2 to decrease as illustrated in FIG. 4 at time t0. The low voltage level VL causes P-channel transistor 34 to be conductive and N-channel transistor 38 to be substantially non-conductive. As signal IN increases to voltage level V2, P-channel transistor 24 becomes substantially non-conductive as shown at time t1, allowing voltage VH at node N1 to decrease to a logic low. The logic low voltage VH causes P-channel transistor 32 to become conductive and N-channel transistor 36 to be substantially non-conductive. When both transistors 32 and 34 become conductive the voltage at node N3 is increased, causing latch 40 to provide a logic low to the input of inverter 46. Inverter 46 then provides a logic high output signal OUT as illustrated at time t2.

Between times t2 and t3, the signal IN begins a transition from a logic high voltage to a logic low. At time t3, the input signal IN is equal to about voltage level V2, causing P-channel transistor 24 to begin to be conductive, and causing voltage VH at node N1 to increase. The logic high voltage VH causes P-channel transistor 32 to be substantially non-conductive and N-channel transistor 36 to be conductive. As signal IN transitions past voltage V1, voltage VL at node N2 is increased at time t4, and P-channel transistor 34 becomes substantially non-conductive and N-channel transistor 38 becomes conductive. Node N3 is reduced to a logic low voltage through transistors 36 and 38, causing output signal OUT to be reduced to a logic low at time t5.

A current labeled "IDD" is illustrated in FIG. 2 and is the total current produced by input buffer 20. As can be seen in FIG. 4, the total current IDD is increased when signal IN transitions from one logic state to another. A peak current during transitions of signal IN increases as the resistance value of variable resistor 28 is decreased. An effect of using a lower resistance value of variable resistor 28, in response to operating at a higher frequency, is that a time difference between logic low transitions of VL and VH between t0 and t1 decreases, causing a peak current of IDD to be greater. Likewise, a time difference between logic high transitions of VL and VH between times t3 and t4 will be shorter, causing a peak current of IDD to be greater.

Input buffer 20 is tri-stated when tri-state signal TRI-STATE is asserted as a logic low voltage. Note that in another embodiment, signal TRI-STATE can be asserted as a logic high. When signal TRI-STATE is asserted, enable signal EN becomes a logic low and enable signal ENB becomes a logic high. P-channel transistor 48 is conductive causing a voltage at the gate of P-channel transistor 32 to be increased so that P-channel transistor 32 cannot become conductive. Likewise, N-channel transistor 50 is conductive causing a voltage at the gate of N-channel transistor 38 to be decreased so the N-channel transistor 38 cannot become conductive. A voltage at node N3 will then be controlled by a logic state that was previously latched in latch 40. Also, mode control logic 32 causes all of transistors 54, 56, 58, and 60 to be substantially non-conductive to prevent a crowbar current through first stage 22. Fluctuations of signal IN will not affect the logic state of output signal OUT.

By controlling the second stage transistors 32, 34, 36, and 38 with the node N1 and N2 voltages as illustrated in FIG. 2, a crowbar current is reduced to a minimum while also providing an input buffer with variable hysteresis. The crowbar is reduced to a minimum because the four transistors of second stage 30 are never on at the same time. Therefore, a current consumption path is not through the second stage 30 but through the first stage. When the circuit 20 is operating in a hysteresis mode, resistor 28 is of a higher value, so more hysteresis is provided with lower current consumption.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A buffer circuit, comprising:
    a first buffer stage, the first buffer stage comprising:
        a signal input;
        a first node responsive to the signal input;
        a second node responsive to the signal input;
        a variable resistive device having a first terminal coupled to the first node and a second terminal coupled to the second node, the variable resistive device for providing a variable resistance between the first and second nodes;
    a second buffer stage, the second buffer stage comprising:
        a signal output;
        a first transistor including a control electrode coupled to the first node;
        a second transistor including a control electrode coupled to the second node;
        a third transistor including a control electrode coupled to the first node;
        a fourth transistor including a control electrode coupled to the second node;
        wherein the first transistor, the second transistor, the third transistor, and the fourth transistor are series coupled transistors coupled between a first voltage terminal and a second voltage terminal.

2. The buffer circuit of claim 1 wherein:
    the variable resistive device includes a fifth transistor including a first current electrode connected to the first node and a second current electrode connected to the second node;
    the fifth transistor includes a control electrode coupled to a mode logic output for selectively controlling the resistance between the first current electrode and the second current electrode of the fifth transistor.

3. The buffer circuit of claim 1 wherein the resistive variable device includes a sixth transistor including a first current electrode connected to the first node and a second current electrode connected to the second node, the sixth transistor being of an opposite conductivity than the fifth transistor, the sixth transistor including a control electrode coupled to a second mode logic output for selectively controlling the resistance between the first current terminal and the second current terminal of the sixth transistor, wherein the second mode logic output is a complementary signal to the mode logic output.

4. The buffer circuit of claim 1 wherein the variable resistive device includes a first operating mode where the resistance between the first node and the second node is at a first resistive value and a second operating mode where the resistance between the first node and the second node is at a second resistance value, the first resistance value being different than the second resistance value.

5. The buffer circuit of claim 4 wherein when the variable resistive device is in the first operating mode, the signal output changes state from a low voltage state to a high voltage states in response to a change in state of the signal input in a first amount of time, when the variable resistive device is in the second operating mode, the signal output changes state from the low voltage state to the high voltage state in response to a change in state of the signal input in a second amount of time, the second amount of time being different than the first amount of time.

6. The buffer circuit of claim 1 wherein the variable resistive device includes:
   a fifth transistor including a first current electrode connected to the first node and a second current electrode connected to the second node;
   a sixth transistor including a first current electrode connected to the first node and a second current electrode connected to the second node;
   wherein the fifth transistor is conductive and the sixth transistor is non conductive during a first operating mode of the variable resistive device, wherein when in the first operating mode, the variable resistive device provides a first resistive value between the first node and the second node;
   wherein the sixth transistor is conductive during a second operating mode of the variable resistive device, wherein when in the second operating mode, the variable resistive device provides a second resistive value between the first node and the second node, the second resistive value being different than the first resistive value.

7. The buffer circuit of claim 1 wherein the first and second transistors are of a first conductivity type and the third and fourth transistors are of a second conductivity type, wherein the first conductivity type is of an opposite conductivity type from the second conductivity type.

8. The buffer circuit of claim 1 further comprising:
   a latch circuit coupled to the signal output to latch a state of the signal output.

9. The buffer circuit of claim 1 wherein the first stage buffer further includes:
   a fifth transistor including a current terminal connected to a first terminal of the variable resistive device and the first node;
   a sixth transistor including a current terminal connected to a second terminal of the resistive device and the second node;
   the fifth transistor and the sixth transistor each including a control terminal connected to the signal input.

10. The buffer circuit of claim 9 wherein:
    the fifth transistor includes a second current terminal coupled to the first voltage terminal;
    the sixth transistor includes a second current terminal coupled to the second voltage terminal.

11. The buffer circuit of claim 1 wherein the first transistor, the second transistor, the third transistor, and the fourth transistor are series coupled transistors coupled between the first voltage terminal and the second voltage terminal such that:
    the first transistor includes a first current terminal coupled to the first voltage terminal and a second current terminal connected to a first current terminal of the second transistor;
    the second transistor includes a second current terminal connected to a first current terminal of the third current terminal and the signal output;
    the third transistor includes a second current terminal connected to a first current electrode of the fourth transistor;
    the fourth transistor including a second current electrode coupled the second voltage terminal.

12. The buffer circuit of claim 1 further comprising:
    a tri-state circuit configured that when enabled, pulls a voltage level of the first node to a voltage level of the first voltage terminal and pulls a voltage level of the second node to a voltage level of the second voltage terminal.

13. The buffer circuit of claim 1 wherein:
    the first node is configured to transition from a high voltage state to a low voltage state in response to the signal input transitioning from a low voltage state to a high voltage state;
    the second node is configured to transition from a high voltage state to a low voltage state in response to the signal input transitioning from a low voltage state to a high voltage state;
    wherein the first node transitions to the low voltage state from the high voltage state in response to the signal input changing state to the high voltage state faster than the second node transitions to the low voltage state from the high voltage state in response to the signal input changing state to the high voltage state.

14. The buffer circuit of claim 1 wherein the first and second transistors are characterized as P-Channel type FETS and the third and fourth transistors are characterized as N-Channel type FETS.

15. The buffer circuit of claim 1 wherein the buffer circuit is configured to provide a hysteresis in the signal output transitioning between voltage states in response to the signal input transitioning between voltage states.

16. The buffer circuit of claim 15, wherein an amount of hysteresis provided by the buffer circuit is dependent upon a resistance level of the variable resistive device.

17. A buffer circuit comprising:
    a signal input;
    a first transistor including a control electrode connected to the signal input;
    a second transistor including a control electrode connected to the signal input;
    a first node connected to a first current terminal of the first transistor;
    a second node connected to a first current terminal of the second transistor;
    a resistive device coupled to provide a resistance between the first node and the second node;
    a third transistor including a control electrode connected to the first node;
    a fourth transistor including a control electrode connected to the second node;
    a fifth transistor including a control electrode connected to the first node;
    a sixth transistor including a control electrode connected to the second node;
    a signal output connected to a current electrode of the fourth transistor and a current electrode of the fifth transistor;
    wherein the third, fourth, fifth, and sixth transistors are coupled in series;

wherein the third transistor and the fourth transistor are of a first conductivity type and the fifth transistor and sixth transistor of a second conductivity type opposite the first conductivity type.

18. The buffer circuit of claim 17 wherein the resistive device is characterized as a variable resistive device.

19. A buffer circuit, comprising:
a first buffer stage, the first buffer stage comprising:
a signal input;
a first node responsive to the signal input;
a second node responsive to the signal input;
a resistive device coupled between the first node and the second node;
a second buffer stage, the second buffer stage comprising:
a signal output;
a first transistor including a control electrode coupled to the first node;
a second transistor including a control electrode coupled to the second node;
a third transistor including a control electrode coupled to the first node;
a fourth transistor including a control electrode coupled to the second node;
wherein the first transistor, the second transistor, the third transistor, and the fourth transistor are series coupled transistors coupled between a first voltage terminal and a second voltage terminal;
a latch circuit coupled to the signal output to latch a state of the signal output;
a tri-state circuit configured that when enabled, pulls a voltage level of the first node to a voltage level of the first voltage terminal and pulls a voltage level of the second node to a voltage level of the second voltage terminal;
wherein the latch circuit is configured to retain the previous state of the signal output prior to the tri-state circuit being enabled.

* * * * *